(12) United States Patent
Kondo et al.

(10) Patent No.: US 9,437,463 B2
(45) Date of Patent: Sep. 6, 2016

(54) HEATING DEVICE

(71) Applicant: NGK INSULATORS, LTD., Nagoya (JP)

(72) Inventors: Nobuyuki Kondo, Taketoyo (JP); Morimichi Watanabe, Nagoya (JP); Asumi Jindo, Okazaki (JP); Yuji Katsuda, Tsushima (JP); Yosuke Sato, Hashima-County (JP); Yoshinori Isoda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 604 days.

(21) Appl. No.: 13/863,729

(22) Filed: Apr. 16, 2013

(65) Prior Publication Data

US 2013/0220988 A1    Aug. 29, 2013

Related U.S. Application Data

(63) Continuation of application No. PCT/JP2011/073769, filed on Oct. 11, 2011.

(30) Foreign Application Priority Data

Oct. 25, 2010  (JP) .................................. 2010-239000
Jun. 17, 2011   (JP) .................................. 2011-135312
Aug. 29, 2011  (JP) ..................... PCT/JP2011/069479

(51) Int. Cl.
*H05B 3/68* (2006.01)
*H01L 21/67* (2006.01)
(Continued)

(52) U.S. Cl.
CPC ............... *H01L 21/67* (2013.01); *B32B 18/00* (2013.01); *C04B 35/58* (2013.01); *C04B 35/581* (2013.01); *C04B 35/6261* (2013.01); *C04B 35/62655* (2013.01); *C04B 35/645* (2013.01);
(Continued)

(58) Field of Classification Search
CPC ....................................................... H05B 3/44
USPC ................... 219/444.1, 544, 638, 634, 443.1
See application file for complete search history.

(56) References Cited

U.S. PATENT DOCUMENTS 3,531,245 A    9/1970  Dietz
5,231,062 A    7/1993  Mathers et al.
(Continued)

FOREIGN PATENT DOCUMENTS

JP    62-028917 A1    2/1987
JP    04-304359 A1    10/1992
(Continued)

OTHER PUBLICATIONS

U.S. Appl. No. 13/863,803. filed Apr. 16, 2013, Kondo et al.
(Continued)

*Primary Examiner* — Dana Ross
*Assistant Examiner* — Ayub Maye
(74) *Attorney, Agent, or Firm* — Burr & Brown, PLLC

(57) ABSTRACT

A heating apparatus includes a susceptor having a heating face of heating a semiconductor and a supporting part joined with a back face of the susceptor. The susceptor comprises a ceramic material comprising magnesium, aluminum, oxygen and nitrogen as main components. The material comprises a main phase comprising magnesium-aluminum oxynitride phase exhibiting an XRD peak at least in $2\theta=47$ to $50°$ by CuK$\alpha$ X-ray.

10 Claims, 7 Drawing Sheets
(1 of 7 Drawing Sheet(s) Filed in Color)

(51) Int. Cl.
    *C04B 35/581*  (2006.01)
    *H05B 1/00*    (2006.01)
    *B32B 18/00*   (2006.01)
    *H05B 3/28*    (2006.01)
    *H01L 21/683*  (2006.01)
    *C04B 35/58*   (2006.01)
    *C04B 35/626*  (2006.01)
    *C04B 35/645*  (2006.01)
    *C04B 37/00*   (2006.01)
    *C23C 14/34*   (2006.01)

(52) U.S. Cl.
    CPC ........... *C04B37/001* (2013.01); *C04B 37/003* (2013.01); *C23C 14/3414* (2013.01); *H01L 21/6831* (2013.01); *H05B 1/00* (2013.01); *H05B 3/283* (2013.01); *C04B 2235/3206* (2013.01); *C04B 2235/3217* (2013.01); *C04B 2235/3222* (2013.01); *C04B 2235/3225* (2013.01); *C04B 2235/3865* (2013.01); *C04B 2235/5445* (2013.01); *C04B 2235/77* (2013.01); *C04B 2235/80* (2013.01); *C04B 2235/96* (2013.01); *C04B 2235/9607* (2013.01); *C04B 2237/08* (2013.01); *C04B 2237/34* (2013.01); *C04B 2237/343* (2013.01); *C04B 2237/36* (2013.01); *C04B 2237/366* (2013.01); *C04B 2237/58* (2013.01); *C04B 2237/704* (2013.01); *C04B 2237/708* (2013.01); *C04B 2237/72* (2013.01); *Y10T 428/24942* (2015.01)

(56) References Cited

U.S. PATENT DOCUMENTS

| | | | |
|---|---|---|---|
| 5,314,675 A | | 5/1994 | Dubots et al. |
| 5,336,280 A | | 8/1994 | Dubots et al. |
| 5,457,075 A | | 10/1995 | Fukushima et al. |
| 5,721,062 A | | 2/1998 | Kobayashi |
| 5,886,863 A | * | 3/1999 | Nagasaki ............ H01L 21/6831 279/128 |
| 6,071,465 A | | 6/2000 | Kobayashi |
| 6,239,402 B1 | | 5/2001 | Araki et al. |
| 6,328,807 B1 | * | 12/2001 | Boek ................... C03B 19/1484 118/724 |
| 6,447,937 B1 | | 9/2002 | Murakawa et al. |
| 6,486,085 B1 | * | 11/2002 | Katsuda ................ C04B 35/581 257/E23.009 |
| 6,551,448 B2 | * | 4/2003 | Kuga ................ H01L 21/68728 118/724 |
| 6,831,307 B2 | * | 12/2004 | Fujii ................. H01L 21/68785 216/88 |
| 6,919,286 B2 | * | 7/2005 | Yoshikawa ........... C04B 35/581 501/96.4 |
| 7,255,934 B2 | | 8/2007 | Hatono et al. |
| 7,553,787 B2 | * | 6/2009 | Yoshikawa ........... C04B 35/581 501/98.4 |
| 2003/0049499 A1 | | 3/2003 | Murakawa et al. |
| 2003/0128483 A1 | | 7/2003 | Kamijo |
| 2003/0183615 A1 | | 10/2003 | Yamaguchi et al. |
| 2005/0173412 A1 | | 8/2005 | Kondou et al. |
| 2006/0240972 A1 | | 10/2006 | Lee et al. |
| 2007/0258281 A1 | | 11/2007 | Ito et al. |
| 2008/0124454 A1 | | 5/2008 | Djayaprawira et al. |
| 2010/0104892 A1 | | 4/2010 | Kobayashi et al. |

FOREIGN PATENT DOCUMENTS

| | | |
|---|---|---|
| JP | 05-319937 A1 | 12/1993 |
| JP | 06-037207 A1 | 2/1994 |
| JP | 08-073280 A1 | 3/1996 |
| JP | 09-219369 A1 | 8/1997 |
| JP | 2000-044345 A1 | 2/2000 |
| JP | 2003-288975 A1 | 10/2003 |
| JP | 3559426 B2 | 9/2004 |
| JP | 2005-203456 A1 | 7/2005 |
| JP | 2006-080116 A1 | 3/2006 |
| JP | 2007-084367 A1 | 4/2007 |
| JP | 2007-300079 A1 | 11/2007 |
| JP | 2008-115065 A1 | 5/2008 |
| JP | 2009-292688 A1 | 12/2009 |

OTHER PUBLICATIONS

U.S. Appl. No. 13/864,467, filed Apr. 17, 2013, Aikawa et al.
U.S. Appl. No. 13/864,559, filed Apr. 17, 2013, Kondo et al.
U.S. Appl. No. 13/869,285, filed Apr. 24, 2013, Aikawa et al.
U.S. Appl. No. 13/478,508, filed May 23, 2012, Watanabe et al.
U.S. Appl. No. 13/478,591, filed May 23, 2012, Watanabe et al.
"Refractory Products," published by Chemical Industry Publisher, dated Jan. 31, 2010 (3 pages).
Chinese Office Action (With English Translation), Chinese Application No. 201180051175.X, dated Mar. 9, 2015 (15 pages).
Arielle Granon, et al., "*Aluminum Magnesium Oxynitride: A New Transparent Spinel Ceramic,*" Journal of the European Ceramic Society, vol. 15, 1995, pp. 249-254.
J. Weiss, et al., "*The System Al-Mg-O-N,*" Communications of the American Ceramic Society, vol. 65, May 1982, C68-C69.
Guotian Ye, et al., "*Synthesis and Oxidation Behavior of MgAlON Prepared from Different Starting Materials,*" J. Am. Ceram. Soc., vol. 93, No. 2, 2010, pp. 322-325.
International Search Report and Written Opinion dated Nov. 15, 2011.

* cited by examiner

HEATING DEVICE

BACKROUND OF THE INVENTION

1. Field of the Invention

The present invention relates to an apparatus of heating semiconductors.

2. Description of Related Art

In a system of producing semiconductors used for dry process or plasma coating in semiconductor production, it has been used halogen-based plasma such as F, Cl or the like having high reactivity for etching or cleaning. It is thus required, for a member equipped to such semiconductor production system, high corrosion resistance, so that it has been generally used a member of an anti-corrosive metal such as aluminum with alumite treatment, HASTELLOY or the like or a ceramic material. Especially, it is necessary high corrosion resistance and low particle generation properties for an electrostatic chuck or heater member supporting and fixing an Si wafer, so that it has been used a high corrosion resistant ceramic member such as aluminum nitride, alumina, sapphire or the like. As these materials are used for a long time, they are gradually corroded to induce particle generation, so that it has been demanded a material whose corrosion resistance is further improved. For attending such demands, it is studied to use, as the material, magnesia, spinel ($MgAl_2O_4$) or a composite material thereof whose corrosion resistance is higher than that of alumina (For example, Patent document 1; U.S. Pat. No. 3,559,426B).

It is further known a ceramic heater used for heating wafers. In such ceramic heating the wafer uniformly. For example, according to the heating the wafer uniformly. For example, according to the disclosure of Patent Document 2 (Patent Publication No. H08-073280A), a heating resistor is embedded in an aluminum nitride based ceramic plate, to which an aluminum nitride based shaft is bonded to provide a ceramic heater. According to the descriptions of Patent document 3 (Patent Publication No. 2003-288975A), in a ceramic heater with a shaft, a content of metal carbide in a heating resistor is lowered to reduce the deviation of the carbide content in the heating resistor depending on the positions, so that the temperature distribution on its heating face is reduced.

SUMMARY OF THE INVENTION

Usually, in semiconductor production process, a corrosive gas such as halogen based gas or the like is used for cleaning of a system for preventing contamination of a wafer. Further, it is required temperature uniformity on the wafer for forming a film uniformly on the wafer. As a member of holding and further heating an Si wafer in a semiconductor production system, it has been widely used a ceramic heater made of AlN (aluminum nitride) as exiting art, resulting in good temperature uniformity on the wafer in initial stage. However, AlN is corroded by cleaning with the corrosive gas, so that the shape and roughness of the surface of the heater are changed and the temperature distribution is thereby changed during its use life. It is problematic that the temperature uniformity cannot be maintained.

Further, in the ceramic heater having the shaft as described above, even in the case that the uniformity of temperature distribution, that is temperature uniformity, is good around a designed temperature, the temperature uniformity may be deteriorated in a temperature range different from the designed temperature. For example, as the heating resistor is heated so that the temperature of the ceramic heater exceeds the designed temperature, hot spot is generated near the center of a heating face of the ceramic plate to result in a large difference of the center and outer periphery of the heating face and deterioration of temperature uniformity. Then, as the temperature uniformity is deteriorated in the range different from the designed temperature, it is designed ceramic heaters having different designed temperatures corresponding with different process temperatures as required in etching, CVD or the like of the wafer. Recently, however, it becomes necessary to change the temperature during a process, so that it is demanded a heater whose temperature uniformity is resistive against such temperature change.

Further, as AlN has a high thermal conductivity, heat dissipation from the AlN shaft is large. For compensating the heat dissipation, it is necessary to change the calorific values in the center and outer peripheral part of the plate. As a use temperature is changed, balance of heat generation and heat dissipation is also changed. It is thus impossible to use such AlN heater in a wide temperature range while maintaining good temperature uniformity and problematic.

An object of the present invention is, in a ceramic heating apparatus used for processing semiconductors, to reduce particles when the apparatus is used under halogen corrosive gas or its plasma atmosphere, and to maintain temperature uniformity for a long period of time.

Another object of the present invention is, in a ceramic heating apparatus used for processing semiconductors, to realize good temperature uniformity in a wide temperature range.

The present invention provides a heating apparatus comprising:

a susceptor comprising a heating face of heating a semiconductor and a back face and a supporting part joined with the back face of the susceptor. The susceptor comprises a ceramic material comprising main components comprising magnesium, aluminum, oxygen and nitrogen, and the ceramic material comprises a main phase comprising magnesium-aluminum oxynitride phase exhibiting an XRD peak at least in $2\theta=47$ to $50°$ taken by using $CuK\alpha$ X-ray.

The ceramic material of the present invention includes the magnesium-aluminum oxynitride phase as its main phase, and is superior in corrosion resistance against strong corrosive gas such as halogen based gas, compared with aluminum nitride. By forming the susceptor with such ceramic material, the surface state is not susceptible to change by the corrosion when it is used for a long time under corrosive condition. As a result, it becomes possible to maintain good temperature uniformity on a wafer for a long time.

According to a preferred embodiment, a supporting part of supporting the susceptor is formed of the ceramic material. The ceramic material has a thermal conductivity lower than that of aluminum nitride. By supporting the susceptor with the supporting part formed of this ceramic material, it is possible to obtain good temperature uniformity on a wafer in a wide temperature range for use.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

Figure 1:
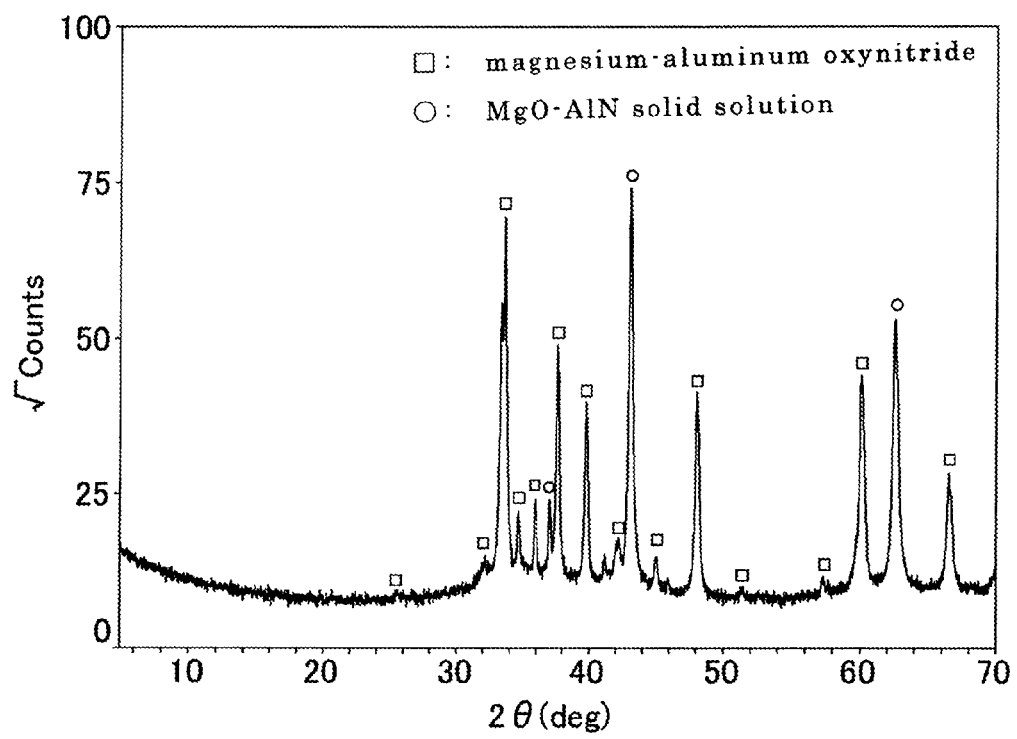
FIG. 1 is an XRD analytical chart obtained in Experiment 1.

The novel ceramic material used in the present invention will be described first, and details of the heating apparatus will be described later.

(Ceramic Material)

The inventors intensively studied corrosion resistance of a ceramic material produced by molding a mixture of magnesium oxide, alumina and aluminum nitride powders and by sintering the mold by hot press sintering. As a result, it was found that considerably high corrosion resistance can be obtained by the ceramic material including a main phase composed of magnesium-aluminum oxynitride having an XRD peak at a specific position.

That is, the inventive ceramic material comprises main components comprising magnesium, aluminum, oxygen and nitrogen, and the ceramic material comprises a main phase comprising magnesium-aluminum oxynitride phase exhibiting an XRD peak at least in $2\theta=47$ to $50°$ taken by using CuKα ray.

The ceramic material of the present invention has corrosion resistance comparable with, or superior than, that of spinel. Therefore, the inventive susceptor can endure against halogen based plasma such as F, Cl or the like used in a semiconductor production process for a long time, so that it is possible to reduce an amount of particles generated from the susceptor member. Moreover, even when the susceptor is used for a long time under corrosive condition, the change of the surface state due to corrosion can be reduced, so that it is possible to obtain good temperature uniformity on a wafer for a long time.

The inventive ceramic material includes main components including magnesium, aluminum, oxygen and nitrogen, and the ceramic material includes a main phase comprising the magnesium-aluminum oxynitride phase exhibiting an XRD peak at least in $2\theta=47$ to $50°$ taken by using CuKα ray. As the magnesium-aluminum oxynitride has corrosion resistance against halogen based plasma comparable with, or superior than, that of spinel, it is considered that the inventive ceramic material including the oxynitride as its main phase also exhibits high corrosion resistance. Further, the magnesium-aluminum oxynitride has corrosion resistance comparable with that of spinel, and at the same time, can have a linear thermal expansion coefficient lower than that of spinel.

The inventive ceramic material may contain, as a sub phase, crystal phase of MgO—AlN solid solution composed of magnesium oxide to which aluminum nitride is dissolved. The MgO—AlN solid solution is also anti-corrosive, so that it is not problematic if it is contained as a sub phase. The XRD peaks at (200) and (220) faces of the MgO—AlN solid solution taken by using CuKα ray may be observed in ranges of $2\theta=42.9$ to $44.8°$ and $62.3$ to $65.2°$, respectively, which are between peaks of cubic phase of magnesium oxide and cubic phase of aluminum nitride, respectively. Further, XRD peak at (111) face may be observed in a range of $2\theta=36.9$ to $39°$, which is between peaks of cubic phase of magnesium oxide and cubic phase of aluminum nitride. Since it may be difficult to distinguish the peak at (111) face from the peaks corresponding with the other crystalline phases, only the XRD peaks at (200) face and (220) face may be observed in the above ranges. Similarly, it may be difficult to distinguish the peak at (200) face or the peak at (220) face from the peaks corresponding with the other crystalline phases.

In the inventive ceramic material, for obtaining corrosion resistance comparable with, or higher than, that of spinel, the content of AlN crystal phase may preferably be lower and more preferably AlN crystal phase is not contained, because the corrosion resistance tends to be deteriorated in the case that AlN crystal phase is contained as the sub phase. Further, since the corrosion resistance of spinel is higher than those of alumina and AlN crystals, a small amount of spinel may be contained. However, since the corrosion resistance of spinel is inferior to that of the inventive magnesium-aluminum oxynitride phase or MgO—AlN solid solution, it is preferred that the content of spinel is lower. On the other hand, for lowering the linear thermal expansion coefficient while maintaining the corrosion resistance comparable with that of spinel, a small amount of spinel or AlN crystal phase may be contained.

In the inventive ceramic material, for obtaining corrosion resistance comparable with, or higher than, that of spinel, a molar ratio of magnesium/aluminum in powdery raw material may preferably be 0.20 or higher and 2 or lower, and more preferably be 0.75 or higher and 2 or lower. In the case that the molar ratio of magnesium/aluminum is lower than 0.20, it might be concerned that an amount of generation of either of aluminum nitride, spinel and aluminum nitride would becomes large to result in reduction of the superior anti-corrosion characteristics. In the case that the molar ratio of magnesium/aluminum exceeds 2, the MgO—AlN solid solution tends to become a main phase. On the other hand, for lowering the linear thermal expansion coefficient while maintaining the corrosion resistance comparable with that of spinel, the molar ratio of magnesium/aluminum in the powdery raw material may preferably be 0.05 or higher and 1.5 or lower, and more preferably be 0.1 or higher and 1 or lower.

An open porosity of the inventive ceramic material may preferably be 5% or lower. Here, the open porosity means a value measured by Archimedean method using pure water as an medium. In the case that the open porosity exceeds 5%, there would be a risk that the strength is lowered or the material itself would become susceptible to removal of grains and the resultant particle generation, and particle components tends to be stored in the pores during the processing of the material, which is not preferred. Further, it is preferred that the open porosity is nearer to zero as possible. The lower limit of it is not particularly defined.

According to the inventive ceramic material, the linear thermal expansion coefficient of the magnesium-aluminum oxynitride forming the main phase in a range of 40 to $1000°$ C. is 6 to 7 ppm/K. Thus, by changing the ratios of the sub-components such as the MgO—AlN solid solution (12 to 14 ppm/K), spinel (8 to 9 ppm/K), and aluminum nitride (5 to 6 ppm/K), the linear thermal expansion coefficient can be controlled in a range of 5.5 to 10 ppm/K while maintaining the high corrosion resistance. However, since spinel or aluminum nitride is lower in the corrosion resistance than the magnesium-aluminum oxynitride or MgO—AlN solid solution, the contents thereof may be preferably smaller. By adjusting the thermal expansion as such, it is possible to match the thermal expansion with those of aluminum oxide, yttrium oxide and aluminum nitride used for members for semiconductor production systems. Alternatively, the difference of the thermal expansion coefficients can be reduced. By these, it is possible to laminate or adhere the inventive ceramic material onto a prior material. It is thereby possible to use the inventive ceramic material with high corrosion resistance for a surface part (first structural body) and to use the prior material as a base material for a lower part (second structural body). Such layered structure and the adjustment of thermal expansion are particularly effective especially in the co-sintering process. Among them, by using a material mainly composed of aluminum nitride as the base material of the second structural body, it becomes easier to maintain a high thermal conductivity and to maintain the surface temperature uniformity of the ceramic material with high corrosion resistance. Such construction is especially effective in a system of producing semiconductors of so-called heater embedded type.

(Production of Ceramic Material)

The inventive ceramic material can be produced by molding powdery mixture of magnesium oxide, alumina and aluminum nitride and then sintering. For example, for obtaining high corrosion resistance comparable with, or higher than, that of spinel, 15 mass percent or more and 66.2 mass percent or less of magnesium oxide, 63 mass percent or less of alumina and 57.7 mass percent or less of aluminum nitride may be mixed to obtain powdery mixture, which may be molded and then sintered. Further, 37 mass percent or more and 66.2 mass percent or less of magnesium oxide, 63 mass percent or less of alumina and 57.7 mass percent or less of aluminum nitride may be mixed to obtain powdery mixture, which may be molded and then sintered. On the other hand, for lowering the linear thermal expansion coefficient to improve temperature uniformity while maintaining the corrosion resistance comparable with that of spinel, 5 mass percent or more and 60 mass percent or less of magnesium oxide, 60 mass percent or less of alumina and 90 mass percent or less of aluminum nitride may be mixed to obtain powdery mixture, which may be molded and then sintered. Further, the sintering temperature may preferably be 1750° C. or higher. In the case that the sintering temperature is lower than 1750° C., it would be a risk that the targeted magnesium-aluminum oxynitride would not be generated, which is not preferred. Besides, although the upper limit of the sintering temperature is not particularly limited, it may be 1850° C. or 1900° C., for example. Further, hot press sintering may be preferably applied for the sintering, and a pressure during the hot press sintering may preferably be set in a range of 50 to 300 kgf/cm$^2$. Atmosphere during the sintering may preferably be that which does not affect the sintering of the oxide raw material, and may preferably be an inert atmosphere such as nitrogen, argon, helium atmosphere or the like. The pressure for the molding is not particularly limited and may be adjusted at any pressure as far as it is possible to maintain the shape.

(Heating Apparatus)

Figure 5:
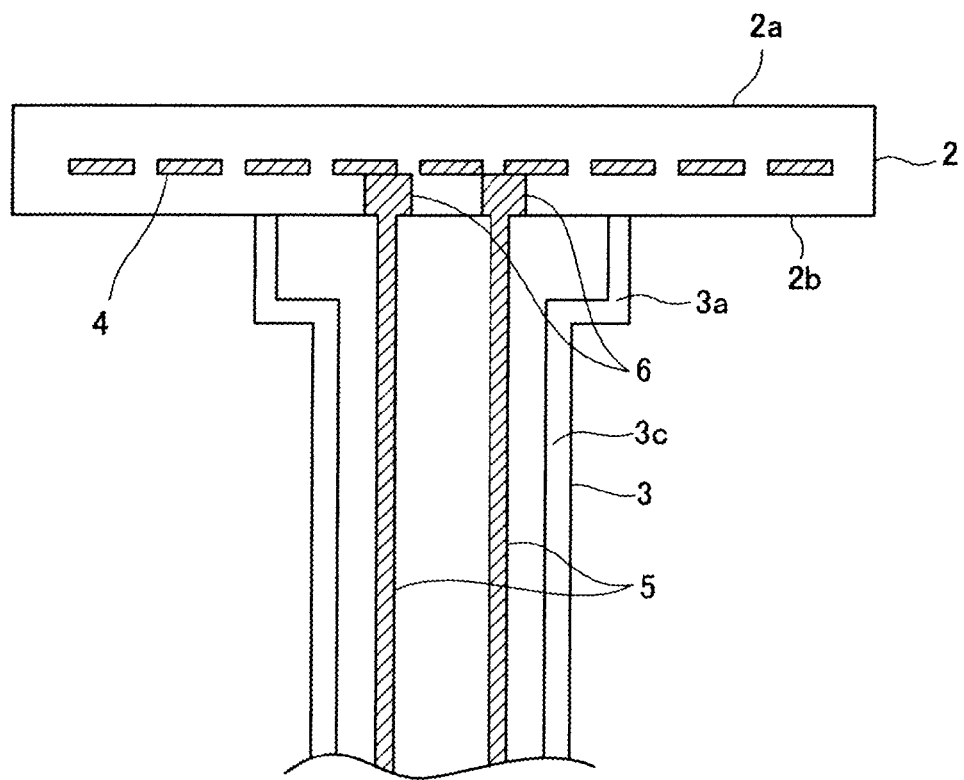
FIG. 5 is a cross sectional view schematically showing a heating apparatus according to an embodiment of the present invention.
Figure 6:
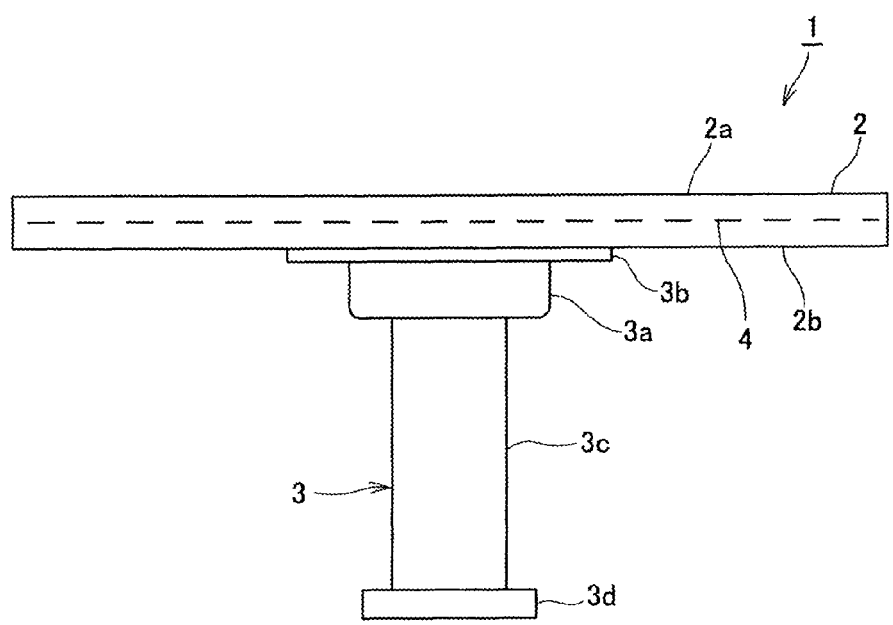
FIG. 6 is a front view schematically showing appearance of a heating apparatus according to an embodiment of the present invention.

The heating apparatus of the present invention includes a susceptor having a heating face for heating a semiconductor and a supporting part joined to a back face of the susceptor. FIGS. 5 and 6 schematically illustrate such heating apparatus.

A susceptor 2 is plate-shaped, and an upper face 2a of the susceptor 2 is a semiconductor heating face. The semiconductor heating face 2a is not necessarily flat, and the heating face may be roughened, or it may be formed a groove having a size comparable with that of a substrate or a groove for flowing purge gas. A supporting part 3 is bonded to a lower face (back face) 2b of the susceptor. According to the present example, the supporting part is tube shaped and a member 5 for supplying electricity is contained inside of the supporting part 3. The member for supplying electricity is connected to a heat resistor 4 embedded within the susceptor.

The susceptor is plate shaped and preferably, substantially circular disk shaped. Although the size of the susceptor is not particularly limited, the diameter is 280 to 380 mm and thickness is 8 to 20 mm, for example. Further, although an outer diameter of a bonding part of the susceptor and supporting part is not particularly limited, the diameter is 60 to 120 mm, for example. It is preferred that the supporting part includes a step therein, a large size part 3a is provided on the side of the susceptor and a small size part 3c is provided on the opposite side with respect to the step. Flanges 3b and 3d are formed on end parts of the large size part 3a and small size part 3c, respectively the flange 3b is not shown in the example of FIG. 5). Then, the end part of the large size part is bonded to the back face of the susceptor so that the center axis of the supporting part is concentric with that of the susceptor.

Here, although the heating member may preferably be embedded within the susceptor, the heating member may be fitted to the susceptor. Alternatively, the heating member may be an outer heating member, such as an infrared ray heating device, fitted at a position distant from the susceptor.

According to the present invention, although the susceptor is formed of the ceramic material, a material forming the supporting part 3 (so called shaft) is not particularly limited and includes the following.

Aluminum nitride, alumina, spinel, magnesium oxide

Preferably, the material of the supporting part 3 is made of the ceramic material described above. Even in this case, however, the ceramic materials forming the susceptor and supporting part are not necessarily identical and may be of compositions different from each other in the composition range as described above.

The inventors have studied the cause of the deterioration of the temperature uniformity as the temperature is deviated from a designed temperature, and thus considered that contribution of thermal conduction by radiation to heat dissipation becomes dominant to heat dissipation among three kinds of thermal conduction ways at a high temperature. For example, as the supporting part is bonded to the central part of the susceptor, solid thermal conduction predominant at a low temperature largely contributes to the heat dissipation so that heat escape through the central part of the susceptor is dominant at a low temperature and the temperature at the central part does not become higher. It can be speculated, however, as follows. At a high temperature, the contribution of the thermal conduction by radiation becomes relatively larger, so that the heat dissipation is facilitated through radiation at the outer periphery without the supporting part compared with the central part of the susceptor. The heat dissipation through radiation from the outer periphery becomes larger and the temperature at the outer periphery becomes lower than that of the central part, so that the temperature uniformity would be deteriorated at a high temperature. Therefore, as the supporting part is formed of the ceramic material described above, the thermal conductivity is lower than that of aluminum nitride or the like, so that it is easier to obtain good temperature uniformity in a wider working temperature range.

A wire conductor may be bent and processed to a wounded body, which may be used as the heating member, for example. The wire diameter of the heating member is about 0.3 to 0.5 mm, and the winding diameter in the case of a coil shaped member is about 2 to 4 mm and the pitch is about 1 to 7 mm. The "winding diameter" referred to herein means an inner diameter of the coil forming the heating member.

As the shape of the heating member, in addition to the coil shape, various shapes may be applied such as ribbon, mesh, coil spring, sheet, printed electrode or the like. Further, in a part adjoining a through hole formed for supplying purge gas, lift pin or the like, the pattern of the heating member 12 may be optionally changed, for example, the heating member 12 may be turned away from the through hole. As the material of the heating member 12, it may be preferably used a conductive material with a high melting point such as molybdenum (Mo), tungsten (W), niobium (Nb) or the like.

In the susceptor of the heating apparatus, it may be embedded a radio frequency electrode for generating plasma over the susceptor. A material forming the radio frequency electrode may be those described above for the heating member.

(Halogen Based Corrosive Gas)

The inventive susceptor is superior in the corrosion resistance against the halogen based corrosive gas and its plasma, and especially excellent in the corrosion resistance against the following halogen based corrosive gasses, the mixtures and plasmas.

$NF_3$, $CF_4$, $ClF_3$, $Cl_2$, $BCl_3$, HBr

EXAMPLES (Production and Evaluation of Ceramic Material)

Preferred applications of the present invention will be described below. As MgO, $Al_2O_3$ and AlN raw materials, they were used commercial products each having a purity of 99.9 mass percent or higher and an average particle size of 1 μm or lower. Here, as about 1 percent of oxygen is inevitable in the AlN raw material, the above described purity is calculated after oxygen content is excluded from the impurity contents. Further, even in the case that it is used MgO material having a purity of 99 mass percent or higher, it could be produced a ceramic material comparable with that produced by using MgO material having a purity of 99.9 mass percent or higher.

1. Ceramic Material

First, it will be described the ceramic material containing magnesium, aluminum, oxygen and nitrogen as the main components (Experiments 1 to 19). Besides, the experiments 1 to 3 and 6 to 16 correspond to inventive examples and experiments 4, 5 and 17 to 19 correspond to comparative examples.

Experiments 1 to 3

(Formulation)

Raw materials of MgO, $Al_2O_3$ and AlN were weighed according to the mass % shown in table 1, and then wet-mixed using isopropyl alcohol as a solvent, nylon pot and alumina grinding stone with a diameter of 5 mm for 4 hours. After the mixing, slurry was collected and dried in nitrogen flow at 100° C. Thereafter, the dried matter was passed through a sieve of 30 mesh to obtain formulated powder. Besides, the molar ratio of Mg/Al in the formulated powder was 1.2

(Molding)

The formulated powder was subjected to uniaxial press molding at a pressure of 200 $kgf/cm^2$ to produce a disk-shaped molded body having a diameter of about 35 mm and a thickness of about 10 mm, which was then contained in a graphite mold for sintering.

(Sintering)

The disk-shaped body was subjected to hot press sintering to obtain the ceramic material. The hot press sintering was performed at a pressure of 200 $kgf/cm^2$ and at a sintering temperature (the maximum temperature) shown in table 1, in Ar atmosphere until the completion of the sintering. The holding time at the sintering temperature was made 4 hours.

Experiment 4

The ceramic material was obtained according to the same procedure as the Experiment 1, except that raw materials of MgO and $Al_2O_3$ were weighed according to the mass % shown in table 1.

Experiment 5

The ceramic material was obtained according to the same procedure as the Experiment 1, except that the sintering temperature was set at 1650° C.

Experiments 6 to 12

The ceramic material was obtained according to the same procedure as the Experiment 1, except that raw materials of MgO, $Al_2O_3$ and AlN were weighed according to the mass % shown in table 1 and that the sintering temperature was made that shown in table 1.

Experiments 13 to 19

The ceramic material was obtained according to the same procedure as the Experiment 1, except that raw materials of MgO, $Al_2O_3$ and AlN were weighed according to the mass % shown in table 1, that the sintering temperature was made that shown in table 1, and that the atmosphere during the sintering was made $N_2$.

(Evaluation)

Each of the materials obtained in the experiments 1 to 19 was processed adapted for various evaluation procedures and the following evaluations were performed. The result of each evaluation was shown in table 1. Besides, according to each of the experiments 1 to 19, another sample having a diameter of 50 mm was also produced and it was proved that the samples provided evaluation results similar to those shown in table 1.

(1) Bulk Density, Open Porosity

They were measured according to Archimedean method using pure water as an medium.

(2) Evaluation of Crystal Phase

The material was ground using a mortar and its crystal phase was identified by an X-ray diffraction system. The condition of the measurement was made CuKα, 40 kV, 40 mA, and 2θ=5 to 70° with a sealed tube type X-ray diffraction system ("D8-ADVANCE" supplied by Bruker AXS corporation) used.

(3) Etching Rate

The surface of each of the materials was polished to a mirror face, which was then subjected to corrosion resistance test using an ICP plasma corrosion resistance test system according to the following conditions. The step of a masked face and exposed face was measured by a step gauge and the step value was divided by a test time period to calculate the etching rate of each material.

ICP: 800 W, Bias: 450 W, Introduced gas: NF3/O2/Ar=75/35/100 sccm, 0.05 Torr (6.67 Pa), Exposed time period: 10 hr, Temperature of sample; Room temperature (4) Constituent Atoms The detection, identification and analysis of content of each constituent atom were performed using EPMA.

(5) Average Linear Thermal Expansion Coefficient (40 to 1000° C.)

The measurement was performed using a dilatometer (supplied by Bruker AXS corporation) under argon atmosphere.

(6) Bending Strength

It was measured by bending strength test according to JIS-R1601.

(7) Measurement of Volume Resistivity

It was measured a method according to JIS-C2141 in air at room temperature (25° C.). The shape of a test sample was of a diameter of 50 mm×(0.5 to 1 mm), and a main electrode with a diameter of 20 mm, a guard electrode with an inner diameter of 30 mm and an outer diameter of 40 mm and an applying electrode with a diameter of 40 mm were formed, while the electrodes were made of silver. A voltage of 2 kV was applied and it was read a current value at a time point 1 minute after the application of the voltage, and the current value was used to calculate a volume resistivity at room temperature. Further, as to the Experiments 7 and 19 (MgO sintered body), it was measured in vacuum (0.01 Pa or below) and at 600° C. The shape of a test sample was of a diameter of 50 mm×(0.5 to 1 mm), and a main electrode with a diameter of 20 mm, a guard electrode with an inner diameter of 30 mm and an outer diameter of 40 mm and an applying electrode with a diameter of 40 mm were formed while the electrodes were made of silver. A voltage of 500V/mm was applied and it was read a current value at a time point 1 hour after the application of the voltage, and the current value was used to calculate a volume resistivity. Further, in values of the volume resistivity shown in table 1, "aEb" represents a $\times 10^b$, and, for example, "1E16" represents $1 \times 10^{16}$.

(Evaluation Results)

FIG. 1 shows an XRD analytical chart obtained in Experiment 1. Further, XRD analytical charts obtained in Experiments 2 and 3 were proved to be substantially same as that in the Experiment 1, the charts were not shown. Further, table 1 shows crystal phases detected in all of the Experiments 1 to 19. As shown in FIG. 1, the XRD analytical charts of the ceramic materials according to the Experiments 1 to 3 include a plurality of unidentified peaks (□ in FIG. 1) and peaks (○ in FIG. 1) corresponding with the MgO—AlN solid solution composed of magnesium oxide into which aluminum nitride is dissolved. The unidentified peaks "□" include peaks in a range of 2θ=47 to 49° (47 to 50°) which do not correspond with those of magnesia, spinel and aluminum nitride, and it was assumed to be magnesium-aluminum oxynitride. Besides, these peaks of the magnesium-aluminum oxynitride are not identical with those of MgAlON (or MAGALON) shown in reference 1 (J. Am. Ceram. Soc., 93 [2] pages 322 to 325 (2010)) and reference 2 (Japanese Patent Publication No. 2008-115065A). Generally, the MgAlON is known to be spinel with N component dissolved therein, and it is thus considered that its crystal structure is different from that of the inventive magnesium-aluminum oxynitride.

Figure 2:
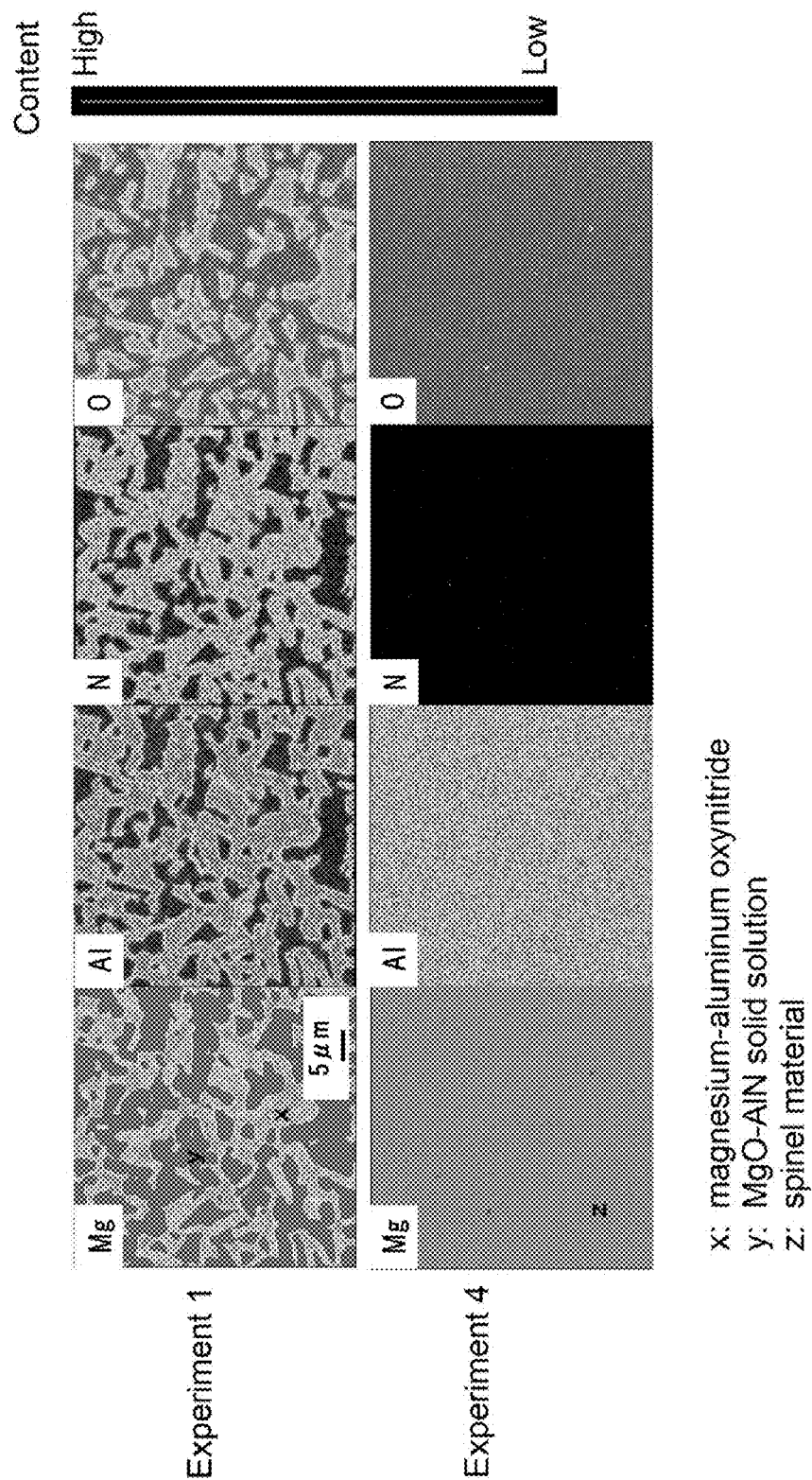
FIG. 2 is EPMA element mapping images obtained in Examples 1 and 4.

The XRD peaks corresponding with (111) face, (200) face and (220) face of the MgO—AlN solid solution were shown in 2θ=36.9 to 39°, 42.9 to 44.8° and 62.3 to 65.2°, respectively, which are between the peaks of cubic phase of magnesium oxide and cubic phase of aluminum nitride. FIG. 2 shows EPMA element mapping images obtained in the Experiment 1. As shown in FIG. 2, it was proved that the material of the Experiment 1 is composed of the two phases of the magnesium-aluminum oxynitride ("x" part) shown in FIG. 1 and the MgO—AlN solid solution ("y" part) and that the former forms the main phase. Here, the main phase means a component occupying 50 percent or more in volume ratio, and sub-phase means a phase other than the main phase and whose XRD phase is identified. A ratio of area at an observed cross section is considered to reflect the volume ratio, so that the main phase is defined as an area having a area ratio of 50 percent or more in an EPMA element mapping image and the sub phase is defined as an area other than the main phase. As shown in FIG. 2, the ratio of area of the magnesium-aluminum oxynitride was about 66 percent and the magnesium-aluminum oxynitride was proved to be the main phase. Besides, "x" part is identified as the magnesium-aluminum oxynitride, because it was composed of four components of Mg, Al, O and N, and the contents of Mg and N were higher than, Al content was close to and O content was lower than those in spinel material ("z" part) obtained in the Experiment 4. That is, the magnesium-aluminum oxynitride is characteristic in containing more Mg than spinel. Similar analysis was performed for the other Experiments and, for example, it was proved that the ratio of area of the magnesium-aluminum oxynitride was about 87 percent to constitute the main phase in the Experiment 10. Further, although the judgment of the main and sub phases was performed by the EPMA element mapping according to the present example, another method may be applied as far as it is possible to distinguish the volume ratio of each phase.

Besides, an EPMA element mapping image is divided into colors of red, orange, yellow, yellowish green, green, blue and indigo blue depending on the contents, so that red, indigo blue and black correspond to the highest content, the lowest content and zero, respectively. However, as FIG. 2 is shown in monochrome, the following description is given for original colors in FIG. 2 below. According to the Experiment 1, "x" and "y" parts were colored in yellowish green and red for Mg, respectively, "x" and "y" parts were colored in orange and blue for Al, respectively, "x" and "y" parts were colored in orange and blue for N, respectively, and "x" and "y" parts were colored in aqua blue and orange for O, respectively. According to the Experiment 4, the whole area ("z" part) was colored in green for Mg, the whole area was colored in orange for Al, the whole area was colored in black for N, and the whole area was colored in red for O.

Figure 3:
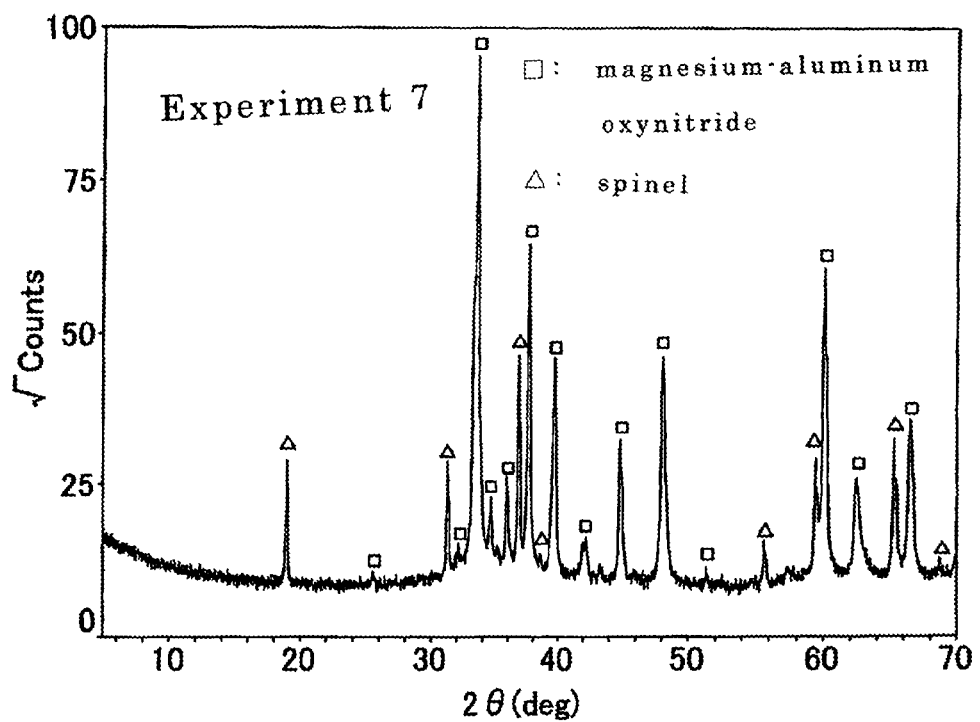
FIG. 3 is an XRD analytical chart obtained in Experiment 7.
Figure 4:
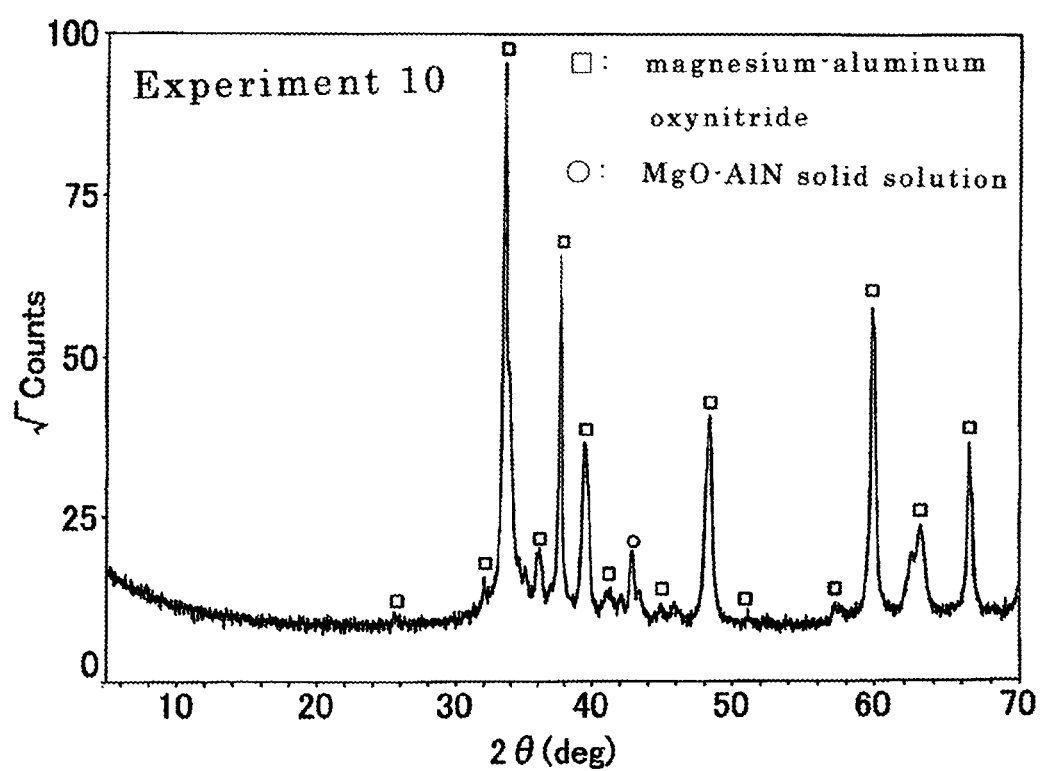
FIG. 4 is an XRD analytical chart obtained in Experiment 10.

Further, according to the Experiment 4, as aluminum nitride was not used, the above described magnesium-aluminum oxynitride was not generated, so that the ceramic material contained, as the main phase, spinel ($MgAl_2O_4$). According to the Experiment 5, as the sintering temperature was low, the above described magnesium-aluminum oxynitride was not generated, so that the ceramic material contained magnesium oxide as the main phase and spinel and aluminum nitride as the sub phases. FIGS. 3 and 4 show XRD analytical charts of the Experiments 7 and 10, respectively. As can be seen from FIGS. 3 and 4, it was mainly detected the magnesium-aluminum oxynitride (□ in the figures) having peaks in a range of 2θ=47 to 49° (or 47 to 50°) in the Experiments 7 and 10, and spinel (Δ in the figure) and MgO—AlN solid solution (○ in the figure) were found as the sub phases in the Experiments 7 and 10, respectively. Besides, the XRD analytical charts were omitted as to the Experiments 6, 8, 9, 11 and 12 and the main and sub phases are shown in table 1.

Then, the etching rates of the ceramic materials of the Experiments 1 to 3 and 6 to 8 were as low as 80 percent or lower, and the etching rates in the Experiments 9 to 12 were as low as 90 percent or lower, of that in the Experiment 4. It was thus proved that the corrosion resistance was very high. As that of the Experiment 5 includes much amounts of spinel and aluminum nitride with lower corrosion resistance, the etching rate was proved to be higher. Besides, the etching rate of alumina shown in the Experiment 18 was higher than that of the ceramic material (spinel) of the Experiment 4. The ceramic materials of the Experiments 1 to 3 and 6 to 8 have sufficiently high bending strengths and volume resistivities.

It was further measured an etching rate at high temperature. Here, for the ceramic materials of the Experiments 2 and 10, the surface of each of the materials was polished to a mirror face and subjected to corrosion resistance test at high temperature under the following conditions using an ICP plasma corrosion resistance test system. Then, a step between the masked face and exposed face measured by a step gauge is divided by a test time period to calculate the etching rate of each material. As a result, the etching rate of each material was 1/3 or lower of that of alumina, 1/5 or lower of that of aluminum nitride, and comparable with that of spinel, and the corrosion resistance against plasma at high temperature was also good.

ICP: 800 W, Bias: none, Introduced gas: $NF_3/Ar=300/300$ sccm, 0.1 Torr, Exposed time: 5 h, Temperature of sample: 650° C.

According to the ceramic materials of the Experiments 12 to 16, the etching rate (212 to 270 nm/h) was very close to that of spinel of the Experiment 4, and the linear thermal expansion coefficient (5.8 to 6.9 ppm/K) was lower than that of spinel. That is, the ceramic materials of the Experiments 12 to 16 were proved to have corrosion resistance comparable with that of spinel while providing a lower linear thermal expansion coefficient, so that they are useful for materials of an electrostatic chuck and heater, especially heater. Besides, although raw material composition of the Experiment 17 was made identical with that of the Experiment 6, the sintering temperature was made lower. Consequently, its main phase was not the magnesium-aluminum oxynitride but spinel, so that its corrosion resistance was lowered and linear thermal expansion coefficient was higher compared with those of the Experiment 6. Further, the ceramic materials of the Experiments 12 to 16 have sufficiently high bending strength and volume resistivity.

Further, the volume resistivity at 600° C. in the Experiments 7 and 19 were $5\times10^8$ Ω·cm and $2\times10^{12}$ Ω·cm, respectively. It was proved that the ceramic material having, as the main phase, the magnesium-aluminum oxynitride phase having an XRD peak at least in a range of 2θ=47 to 49° (or 47 to 50°) has an electrical resistance lower than that of MgO.

As described above, it is predicted that the ceramic materials produced in the Experiments 1 to 3 and 6 to 16 also have electrical resistances lower than that of magnesium oxide.

TABLE 1

| | Relationship With invention | First Component (MgO) (mass %) | Second Component (Al2O3) (mass %) | Third component (AlN) (mass %) | Mg/Al molar ratio | Sintering Temperature (° C.) | Bulk Density (g/cm3) | Open porosity (%) |
|---|---|---|---|---|---|---|---|---|
| Exp. 1 | Inventive | 51.6 | 21.9 | 26.5 | 1.2 | 1850 | 3.40 | 0.04 |
| Exp. 2 | Example | 51.6 | 21.9 | 26.5 | 1.2 | 1800 | 3.37 | 0.03 |
| Exp. 3 | | 51.6 | 21.9 | 26.5 | 1.2 | 1750 | 3.38 | 0.03 |
| Exp. 4 | Comparative | 28.2 | 71.8 | — | 0.5 | 1850 | 3.57 | 0.01 |
| Exp. 5 | Example | 51.6 | 21.9 | 26.5 | 1.2 | 1650 | 3.47 | 0.01 |
| Exp. 6 | Inventive | 33.3 | 30.2 | 36.4 | 0.7 | 1775 | 3.28 | 0.02 |
| Exp. 7 | Example | 27.6 | 32.8 | 39.6 | 0.4 | 1800 | 3.30 | 0.02 |
| Exp. 8 | | 33.9 | 22.3 | 43.8 | 0.6 | 1800 | 3.28 | 0.01 |
| Exp. 9 | | 28.1 | 24.3 | 47.7 | 0.4 | 1850 | 3.25 | 0.02 |
| Exp. 10 | | 28.1 | 24.3 | 47.7 | 0.4 | 1800 | 3.26 | 0.02 |
| Exp. 11 | | 28.1 | 24.3 | 47.7 | 0.4 | 1750 | 3.26 | 0.03 |
| Exp. 12 | | 18.6 | 27.5 | 54.0 | 0.3 | 1800 | 3.33 | 0.02 |
| Exp. 13 | | 9.6 | 11.0 | 79.4 | 0.1 | 1800 | 3.27 | 0.01 |
| Exp. 14 | | 9.6 | 11.0 | 79.4 | 0.1 | 1850 | 3.27 | 0.08 |
| Exp. 15 | | 24.2 | 25.5 | 50.2 | 0.4 | 1800 | 3.27 | 0.12 |
| Exp. 16 | | 9.4 | 19.4 | 71.2 | 0.1 | 1900 | 3.27 | 0.02 |
| Exp. 17 | Comparative | 33.3 | 30.2 | 36.4 | 0.7 | 1700 | 3.28 | 0.03 |
| Exp. 18 | Example | 0 | 100 | 0 | — | 1700 | 3.94 | 0.01 |
| Exp. 19 | | 100 | 0 | 0 | — | 1500 | 3.57 | 0.30 |

| | Crystal phase | | $NF_3$ Etching Rate (nm/h) | Linear thermal expansion coefficient @40~1000° C. (ppm/K) | Strength (MPa) | Volume Resistivity @25° C. (Ω · cm) | Volume Resistivity @600° C. (Ω · cm) |
|---|---|---|---|---|---|---|---|
| | Main phase | Sub phase | | | | | |
| Exp. 1 | Mg—Al—O—N* | MgO—AlNss** | 176 | 9.5 | 240 | >1E16 | — |
| Exp. 2 | Mg—Al—O—N* | MgO—AlNss** | 177 | 9.3 | 291 | >1E16 | — |
| Exp. 3 | Mg—Al—O—N* | MgO—AlNss** | 179 | 9.6 | 320 | >1E16 | — |
| Exp. 4 | MgAl$_2$O$_4$ | None | 244 | 8.6 | 168 | >1E16 | — |
| Exp. 5 | MgO | MgAl$_2$O$_4$, AlN | 224 | >10 | 350 | >1E16 | — |

TABLE 1-continued

| | | | | | | | |
|---|---|---|---|---|---|---|---|
| Exp. 6 | Mg—Al—O—N* | MgO—AlNss** MgAl$_2$O$_4$ | 181 | 7.7 | 236 | >1E16 | — |
| Exp. 7 | Mg—Al—O—N* | MgAl$_2$O$_4$ | 191 | 7.3 | 242 | >1E16 | 5E8 |
| Exp. 8 | Mg—Al—O—N* | MgO—AlNss** | 195 | 7.6 | 272 | >1E16 | — |
| Exp. 9 | Mg—Al—O—N* | MgO—AlNss** | 210 | 7.1 | 233 | >1E16 | — |
| Exp. 10 | Mg—Al—O—N* | MgO—AlNss** | 209 | 7.1 | 257 | >1E16 | — |
| Exp. 11 | Mg—Al—O—N* | MgO—AlNss** | 211 | 7.1 | 265 | >1E16 | — |
| Exp. 12 | Mg—Al—O—N* | AlN, MgAl$_2$O$_4$ | 219 | 6.9 | 387 | >1E16 | — |
| Exp. 13 | Mg—Al—O—N* | AlN, MgAl$_2$O$_4$ | 270 | 5.8 | 304 | >1E16 | — |
| Exp. 14 | Mg—Al—O—N* | AlN MgAl$_2$O$_4$ | 255 | 6.0 | 304 | >1E16 | — |
| Exp. 15 | Mg—Al—O—N* | MgAl$_2$O$_4$ | 212 | 6.9 | 283 | >1E16 | — |
| Exp. 16 | Mg—Al—O—N* | AlN, MgAl$_2$O$_4$ | 230 | 6.2 | 320 | >1E16 | — |
| Exp. 17 | MgAl$_2$O$_4$ | AlN, MgO | 256 | 8.1 | 400 | — | — |
| Exp. 18 | Al$_2$O$_3$ | None | 623 | 8.0 | 290 | — | — |
| Exp. 19 | MgO | — | — | — | 240 | >1E16 | 2E12 |

*Mg—Al—O—N: Magnesium-aluminum oxynitride (XRD: peaks in 2θ = 47-49°)
**MgO—AlNss: MgO—AlN solid solution
[—]: not measured 2. Laminated Sintering Next, it will be described a laminated body provided by laminated sintering of first and second structural bodies utilizing the ceramic material described above (Experiments 20 to 26). Besides, the Experiments 20 to 24 correspond to the inventive examples and the Experiments 25 and 26 correspond to comparative examples.

Experiments 20 and 21

The ceramic materials of the Experiments 4 and 6 to 12 have average linear thermal expansion coefficients of 7 to 9 ppm/K in 40 to 1000° C. According to the Experiments 20 and 21, as shown table 2, the first structural body was made of the ceramic material of the Experiment 10, and the second structural body was made of aluminum nitride. The first and second structural bodies were laminated and molded to a provide a sample having a diameter of 50 mm, which was subjected to laminated sintering. As the aluminum nitride, it was used aluminum nitride to which 5 mass percent of yttrium oxide was added as a sintering aid in outer addition (that is, 5 mass parts of Y$_2$O$_3$ was added to 100 mass parts of AlN, referred to as AlN [1]), or aluminum nitride to which 50 mass percent of yttrium oxide was added (That is, 50 mass parts of Y$_2$O$_3$ was added to 100 mass parts of AlN, referred to as AlN [2]). As raw materials of aluminum nitride and yttrium oxide, it was used commercial products having a purity of 99.9 mass percent or higher and an average particle size of 1 μm or smaller. Here, as AN material inevitably contains about 1 mass percent of oxygen, the purity was calculated after oxygen is removed from impurity elements. Further, since the average linear thermal expansion coefficient in 40 to 1000° C. was 5.7 ppm/K in AlN [1] and 6.2ppm/K in AlN[2], it is provided a difference of thermal expansion between the first and second structural bodies. Therefore, between the first and second structural bodies, it was provided an intermediate layer in which the raw materials of AlN[1] or AlN[2] and raw materials of the Experiment 10 were mixed. The difference of thermal expansion can be relaxed by the intermediate layer. In the Experiment 20 using AlN[1], the intermediate layer was composed of three layers having mass ratios of 25:75, 50:50 and 75:25, respectively, and in the Experiment 21 using AlN[2], the intermediate layer was composed of two layers having mass ratios or 40:60 and 60:40, respectively. It will be described steps of formulation, molding and sintering below in detail.

(Formulation)

As the raw material of the first structural body, it was used formulated powder produced according to the similar procedure as the Experiment 10 described above. The raw material of the second structural body was produced as described below with aluminum nitride as the main phase. In AlN [1] of the second structural body, first, aluminum nitride powder and yttrium oxide powder were weighed in a ratio of 100 mass percent and 5.0 mass percent, and then wet-mixed using isopropyl alcohol as a solvent, a nylon pot and nylon agitating media for 4 hours. After the mixing, slurry was collected and dried in nitrogen flow at 110° C. Thereafter, it was passed through a sieve of 30 mesh to produce formulated powder. Further, the thus obtained formulated powder was thermally treated at 450° C. for 5 hours or longer in air atmosphere to fire and remove carbon contents included during the wet mixing. The intermediate layer of the laminated body using AlN[1] was formulated as follows. First, the formulated powders of the Experiment 10 and aluminum nitride described above were weighed in mass ratios of 75:25 (intermediate layer 1), 50:50 (intermediate layer 2), and 25:75 (intermediate layer 3), and then wet-mixed using isopropyl alcohol as a solvent, a nylon pot and nylon agitating media for 4 hours. After the mixing, the slurry was collected and then dried in nitrogen flow at 110° C. Thereafter, it was passed through a sieve of 30 mesh to provide formulated powder. AlN[2] of the second structural body was produced according to the same procedure as AlN[1], except that the aluminum nitride powder and yttrium powder were mixed in a ratio of 100 mass percent and 50 mass percent, respectively. Further, the intermediate layer of the laminated body using AlN[2] was formulated according to the same procedure as AlN[1], except that the formulated powder of the Experiment 10 and that of the aluminum nitride described above were mixed in mass ratios of 60:40 (intermediate layer 1) and 40:60 (intermediate layer 2), respectively.

(Molding)

First, the aluminum nitride formulated powder as the raw material of the second structural body was filled in a metal mold having a diameter of 50 mm, and molded by uniaxial pressure molding at a pressure of 200 kgf/cm². The aluminum nitride molded body was not drawn out of the mold, and formulated powders of the intermediate layers were filled thereon in the descending order of aluminum nitride contents, while a pressure of 200 kgf/cm² was applied after each of the filling procedure by uniaxial pressure molding. Lastly, the formulated powder of the Experiment 10 as the raw material of the first structural body was filled and then pressure molded at a pressure of 200 kgf/cm². As to the laminated body using AlN[1], it was prepared a disk-shaped molded body having a total thickness of 23 mm and including an aluminum nitride layer of 10 mm as the second structural body, three intermediate layers each having a thickness of 1 mm and the layer of the Experiment 10 as the first structural body of 10 mm. Further, as to the laminated body using AlN[2], it was prepared a disk-shaped molded body having a total thickness of 22 mm and including an aluminum nitride layer of 10 mm as the second structural body, two intermediate layers each having a thickness of 1 mm and the layer of the Experiment 10 as the first structural body. These laminated and disk-shaped bodies were contained in a graphite mold for sintering.

(Sintering)

The disk-shaped molded body contained in the graphite mold for sintering was subjected to hot press sintering to obtain a ceramic material by integrated sintering. The hot press sintering was performed at a pressure of 200 kgf/cm², a sintering temperature of 1800° C., and in Ar atmosphere until the completion of the sintering. The holding time period at the sintering temperature was made 4 hours. Besides, as to the Experiments 20 and 21, the sintering was also performed at a sintering temperature of 1750° C. (Experiments 20-1 and 21-1).

According to the sintered body obtained in the production method described above, in both of the laminated bodies using AlN[1] (Experiments 20, 20-1) and using AlN[2] (experiments 21 and 21-1), the upper part of the sintered body was composed of the magnesium-aluminum oxynitride with high corrosion resistance, the lower part was composed of a sintered body mainly composed of aluminum nitride with high thermal conductivity and an intermediate layer was provided between them. In the intermediate layer, the Al content was inclined so that the Al content is made higher from the first structural body toward the second structural body. Cracks, fractures or the like were not observed at interfaces of the layers of the sintered bodies. It is considered that thermal stress during the sintering could be avoided by providing the intermediate layer between the first and second structural bodies. Further, by controlling the thermal expansion coefficient of aluminum nitride as the base material, it is possible to reduce thermal stress generated between the base material and the magnesium aluminum oxynitride and thereby to reduce the thickness of the intermediate layer.

Experiments 22 to 24

According to the Experiment 22, as shown in table 2, a laminated body was obtained according to the same procedure as the Experiment 20, except that the first structural body was made of the ceramic material of the Experiment 6, the second structural body was made of aluminum nitride and the laminated sintering was performed without the intermediate layer in $N_2$ atmosphere. According to the Experiment 23, as shown in table 2, a laminated body was obtained according to the same procedure as the Experiment 20, except that the first structural body was made of the ceramic material of the Experiment 6, the second structural body was made of yttrium oxide and the laminated sintering was performed without the intermediate layer in $N_2$ atmosphere. According to the Experiment 24, as shown in table 2, a laminated body was obtained according to the same procedure as the Experiment 20, except that the first structural body was made of the ceramic material of the Experiment 13, the second structural body was made of aluminum nitride AlN[1] and the laminated sintering was performed without the intermediate layer in $N_2$ atmosphere. In all of the Experiments 22 to 24, cracks and fractures were not found at the interfaces between the layers. Further, according to each of the Experiments 22 to 24, the difference of the linear thermal expansion coefficients of the first and second structural bodies was as low as 0.3 ppm/K or lower, so that it was possible to prevent the generation of cracks and fractures without providing the intermediate layer. Besides, according to the Experiments 22 to 24, it may be provided the intermediate layer as the Experiments 20, 20-1, 21 and 21-1.

Experiments 25, 26

According to the Experiment 25, as shown in table 2, a laminated body was obtained according to the same procedure as the Experiment 20, except that the first structural body was composed of alumina, the second structural body was composed of aluminum nitride (AlN[1]), and the laminated sintering was performed in $N_2$ atmosphere. According to the Experiment 26, as shown in table 2, a laminated body was obtained according to the same procedure as the Experiment 20, except that the first structural body was composed of spinel, the second structural body was composed of aluminum nitride (AlN[1]), and the laminated sintering was performed in $N_2$ atmosphere. According to each of the Experiments 25 and 26, cracks were generated at the interface between the layers. This is because the difference between the thermal expansion coefficients of the first and second structural bodies is too large so that it could not prevent the crack formation due to the difference of thermal expansion in spite of providing the intermediate layer.

TABLE 2

| | | First structural body | | Second structural body | | Intermediate layer | | | |
|---|---|---|---|---|---|---|---|---|---|
| | Relationship with invention | Material | Linear thermal expansion coefficient @40~1000° C. (ppm/K) | Material | Linear thermal expansion coefficient @40~1000° C. (ppm/K) | Presence Or Absence | Structure | Sintering tem. ° C. | Presence or absence of crack |
| Exp. 20 | Inventive | Exp. 10 | 7.1 | AlN (AlN[1]) | 5.7 | Present | Three layers(first and second structural bodies in layers(mass ratio) = 75/25, 50/50, 25/75) | 1800 | Present |

TABLE 2-continued

| | Relationship with invention | First structural body | | Second structural body | | Intermediate layer | | Sintering tem. ° C. | Presence or absence of crack |
|---|---|---|---|---|---|---|---|---|---|
| | | Material | Linear thermal expansion coefficient @40~1000° C. (ppm/K) | Material | Linear thermal expansion coefficient @40~1000° C. (ppm/K) | Presence Or Absence | Structure | | |
| Exp. 20-1 | | Exp. 10 | 7.1 | AlN (AlN[1]) | 5.7 | Present | Three layers (first and second structural bodies in layers(mass ratio) = 75/25, 50/50, 25/75) | 1750 | Absent |
| Exp. 21 | | Exp. 10 | 7.1 | AlN (AlN[2]) | 6.2 | Present | Two layers (first and second structural bodies in layers(mass ratio) = 60/40, 40/60) | 1800 | Absent |
| Exp. 21-1 | | Exp. 10 | 7.1 | AlN (AlN[2]) | 6.2 | Present | Three layers(first and second structural bodies in layers(mass ratio) = 75/25, 50/50, 25/75) | 1750 | Absent |
| Exp. 22 | | Exp. 6 | 7.7 | $Al_2O_3$ | 8.0 | Absent | — | 1800 | Absent |
| Exp. 23 | | Exp. 6 | 7.7 | $Y_2O_3$ | 7.9 | Absent | — | 1800 | Absent |
| Exp. 24 | | Exp. 13 | 5.8 | AlN (AlN[1]) | 5.7 | Absent | — | 1800 | Absent |
| Exp. 25 | Comparative | Alumina | 8.0 | AlN (AlN[1]) | 5.7 | Present | Three layers(first and second structural bodies in layers(mass ratio) = 75/25, 50/50, 25/75) | 1800 | Present |
| Exp. 26 | | Spinel | 8.6 | AlN (AlN[1]) | 5.7 | Present | Three layers(first and second structural bodies in layers(mass ratio) = 75/25, 50/50, 25/75) | 1800 | Present |

(Production and Evaluation of Heating Apparatus)

Figure 7:
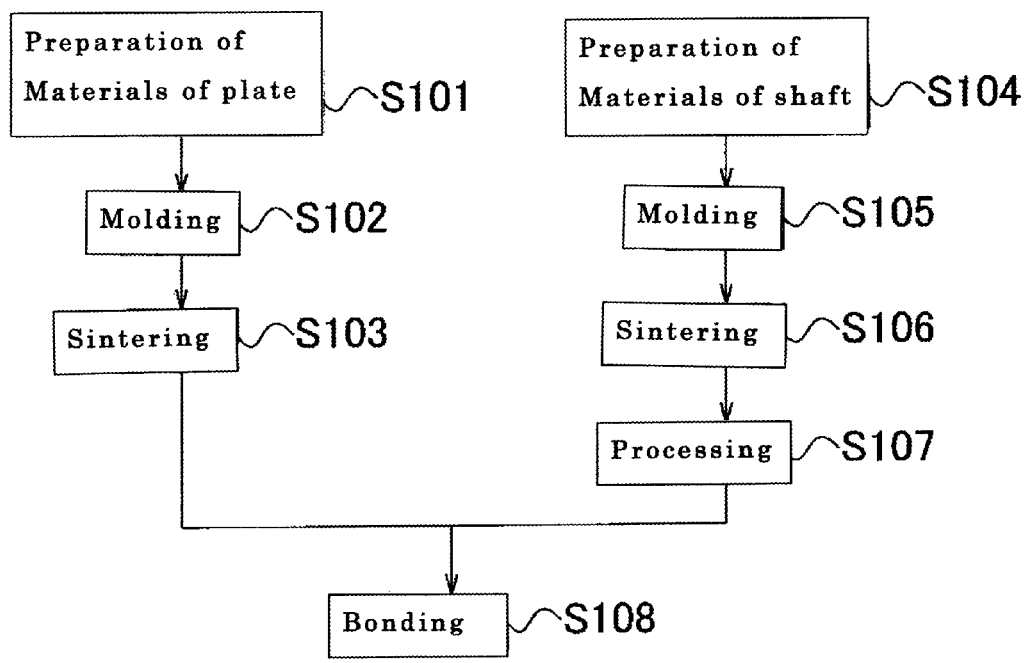
FIG. 7 is a flow chart showing a process of producing a heating apparatus according to an embodiment of the present invention.

It will be described a method of producing a ceramic heater according to an embodiment of the present invention, referring to FIGS. 5 to 7.

(a) First, it was prepared materials of a susceptor (plate) (S101). Specifically, raw materials of MgO, $Al_2O_3$ and AlN forming the plate were weighed according to mass percents shown in table 3, and wet-mixed using isopropyl alcohol as a solvent, a nylon pot, and alumina agitating media with a diameter of 5 mm for 4 hours. The mixing is performed using, for example, a large scale ball mill with its container itself rotated, which is called trommel. After the mixing, the slurry was collected and dried in nitrogen flow at 110° C. It was then passed through a sieve of 30 mesh to produce formulated powder.

Besides, the followings show the relationship between material compositions used in the experimental results (examples) in the following table 3 and used in the examples (table 1) described above.

Experiments No. A1-1, 2, 3: Experiment 2
Experiments No. A2-1, 2, 3: Experiment 10
Experiments No. A3-1, 2, 3: Experiment 12
Experiments No. A4-1, 2, 3: Experiment 14

(b) Next, the thus obtained formulated powder was molded under uniaxial pressing by means of a mechanical press to produce a preliminary molded body (S102). Then, a heat generator 4 and electrical supply terminal part 6 were embedded inside of the preliminary molded body, which was then molded by a mechanical press again.

(c) The molded body produced as described above was contained in a sintering furnace such as of hot press molding and then sintered (S103). According to hot press molding, raw material powder or molded body is filled or inserted in a carbon jig and then sintered at uniaxial pressure of 30 to 50 MPa. This is suitable for sintering of ceramic materials which is difficult to densify by conventional sintering at ambient pressure. The sintering conditions are under sintering temperature of 1600 to 2000° C., a pressure of 100 to 300 kgf/cm$^2$ and sintering time period of 2 to 5 hours.

(d) On the other hand, the supporting part (shaft part) is produced separately from the plate. First, materials of the shaft are prepared (S104). Specifically, formulated powder is prepared according to the same procedure as that of the plate (S101). The thus prepared formulated powder was contained in a sintering furnace such as a cold isostatic press (CIP) and sintered to produce a molded body (S105). CIP is a method of subjecting an uniaxial molded body obtained by metal mold method to isostatic press molding so as to improve the density of and to prevent the ununiformity of the molded body. It is possible to directly fill the raw materials in a rubber mold without performing the molding using a metal mold and to perform CIP processing to obtain a molded body. The thus obtained molded body of shaft is sintered in an ambient pressure sintering furnace or the like (S106). The sintering conditions include a sintering temperature of 1600 to 2000° C., a pressure of 1 to 30 kg/cm$^2$ and a sintering time period of 1 to 5 hours. Then, the shaft is processed in its outer periphery or by lapping (S107).

(e) The plate and shaft obtained according to the procedure as described above are bonded with each other in a sintering furnace by direct bonding process (S108). The sintering conditions include a sintering temperature of 1400 to 2000° C., a pressure of 100 to 300 kg/cm$^2$ and a sintering time period of 2 to 5 hours. A ceramic heater after the bonding is subjected to processing of its side face and connection of terminals in a bonding furnace. Thereafter, washing treatment and evaluation of temperature uniformity are performed.

After a tubular shaft is bonded to the ceramic plate, electrical supply rods 5 made of nickel were bonded by soldering to the connecting terminals 6 through COVAL metal in first and second holes of the ceramic plate using gold solder.

(Heating Apparatus of Comparative Example)

As comparative examples (Experiment Nos. B-1, B-2, B-3), the susceptor 2 and supporting part 3 were formed from aluminum nitride powder (purity of 99.5 percent) with 5 weight percent of yttrium oxide added and bonded with each other to produce heating apparatuses.

(Test Condition)

Corrosion resistance test: ICP: 800 W, Bias: 450 W, Supplied gas: NF$_3$/O$_2$/Ar=75/35/100 sccm, 0.05 Torr, Exposed time period: 100 hours, Temperature of sample 600° C.

Evaluated properties: Temperature uniformity on a wafer, amount of particles and surface roughness before and after the corrosion resistance test described above.

Measurement of Temperature Uniformity

The ceramic heaters of the inventive and comparative examples were set in a vacuum chamber, and a black body wafer for temperature measurement was set on the ceramic heater, which was heated at 200° C., 400° C. or 600° C. (designed temperature). Temperature distribution on the black body wafer at each temperature was measured from the outside of the chamber by infrared ray radiation thermometer (IR camera). Based on the thus obtained temperature distribution, a difference "ΔT" between the maximum and minimum temperatures was calculated. Besides, the heating of the heater at each temperature was controlled by a thermocouple not shown fitted to a back face of the ceramic plate.

Amount of Particles:

The ceramic heaters of the inventive and comparative examples were set in a vacuum chamber and an Si wafer was set on the ceramic heater, which was heated at 200° C., 400° C. or 600° C. (designed temperature). It was measured the amount of particles on a surface of the Si wafer on the side of the mounting face of the ceramic heater after the heating by a particle counter. Besides, the heating of the heater at each temperature was controlled by a thermocouple not shown fitted to a back face of the ceramic plate.

Surface Roughness:

The roughness of the susceptor surface (semiconductor mounting face) was measured by Tailor-Hobson roughness measuring instrument. The measurement was performed at two optional positions in inside and outside parts of the plane.

TABLE 3

| Exp. No. | material | MgO content (%) | Evaluation temp (° C.) | Temperature uniformity on wafer (° C.) | | | Particle amount (counts) | | | Surface roughness Ra (μm) | | |
|---|---|---|---|---|---|---|---|---|---|---|---|---|
| | | | | Before Corrosion resistance test | After 50 RF hours | After 100 RF hours | Before Corrosion resistance test | After 50 RF hours | After 100 RF hours | Before Corrosion resistance test | After 50 RF hours | After 100 RF hours |
| A1-1 | Mg—Al—O—N | 51.6 | 200 | 2.8 | 2.9 | 2.8 | 1,300 | 1,300 | 1,300 | 0.7 | 0.7 | 0.7 |
| A1-2 | Mg—Al—O—N | 51.6 | 400 | 2.6 | 2.6 | 2.7 | 1,400 | 1,500 | 1,400 | 0.7 | 0.7 | 0.7 |
| A1-3 | Mg—Al—O—N | 51.6 | 600 | 2.5 | 2.5 | 2.4 | 1,600 | 1,600 | 1,700 | 0.7 | 0.7 | 0.7 |
| A2-1 | Mg—Al—O—N | 28.1 | 200 | 2.9 | 2.8 | 2.9 | 1,400 | 1,300 | 1,400 | 0.7 | 0.7 | 0.7 |
| A2-2 | Mg—Al—O—N | 28.1 | 400 | 2.8 | 2.8 | 2.7 | 1,500 | 1,400 | 1,400 | 0.7 | 0.7 | 0.7 |
| A2-3 | Mg—Al—O—N | 28.1 | 600 | 2.6 | 2.6 | 2.6 | 1,600 | 1,500 | 1,500 | 0.7 | 0.7 | 0.7 |
| A3-1 | Mg—Al—O—N | 18.6 | 200 | 2.8 | 2.9 | 2.9 | 1,400 | 1,300 | 1,300 | 0.7 | 0.7 | 0.7 |
| A3-2 | Mg—Al—O—N | 18.6 | 400 | 2.7 | 2.7 | 2.7 | 1,400 | 1,400 | 1,400 | 0.7 | 0.7 | 0.7 |
| A3-3 | Mg—Al—O—N | 18.6 | 600 | 2.5 | 2.6 | 2.5 | 1,500 | 1,600 | 1,600 | 0.7 | 0.7 | 0.7 |
| A4-1 | Mg—Al—O—N | 9.6 | 200 | 2.8 | 2.8 | 2.9 | 1,300 | 1,400 | 1,300 | 0.7 | 0.7 | 0.7 |
| A4-2 | Mg—Al—O—N | 9.6 | 400 | 2.7 | 2.6 | 2.7 | 1,400 | 1,400 | 1,500 | 0.7 | 0.7 | 0.7 |
| A4-3 | Mg—Al—O—N | 9.6 | 600 | 2.5 | 2.5 | 2.5 | 1,700 | 1,600 | 1,700 | 0.7 | 0.7 | 0.7 |
| B-1 | AlN | 0 | 200 | 4.5 | 5.7 | 7.0 | 2,100 | 5,300 | 7,400 | 0.7 | 1.0 | 1.2 |
| B-2 | AlN | 0 | 400 | 4.3 | 6.0 | 8.3 | 2,200 | 5,100 | 7,500 | 0.7 | 0.9 | 1.2 |
| B-3 | AlN | 0 | 600 | 2.8 | 5.0 | 7.6 | 2,000 | 6,000 | 8,900 | 0.7 | 1.0 | 1.3 |

According to the comparative examples, at either of the evaluated temperatures of 200 to 600° C., the amount of particles after the gas exposure was large and the surface roughness was deteriorated. Consequently, the temperature uniformity on the wafer was deteriorated. According to the inventive examples, at either of the evaluated temperatures of 200 to 600° C., the amount of particles after the gas exposure was large and the surface roughness was not deteriorated. Consequently, the temperature uniformity on the wafer was maintained. This is due to that the material of the susceptor was made the inventive ceramic material.

Further, according to the comparative examples, although the temperature uniformity on the wafer before the corrosion resistance test was good at 600° C., the temperature uniformity on wafer was deteriorated at the evaluated temperatures of 200° C. and 400° C. According to the inventive examples, at either of the evaluated temperatures of 200 to 600° C., the temperature uniformity on wafer was good not only after the corrosion resistance test but also before the corrosion resistance test. This indicates that, by forming the supporting part (shaft) with the ceramic material of the present invention, it was possible not only to prevent the particle generation but also to prevent deterioration of temperature uniformity due to the escape of heat through the supporting part.

These actions and effects are epoch-making in the field of semiconductor treating system, and it can be understood that various applications are expected in the industries.

Although specific embodiments of the present invention have been described above, the invention is not to be limited to these specific embodiments and can be performed with various changes and modifications, without departing from claims.

The invention claimed is:

1. A heating apparatus for a semiconductor manufacturing system comprising:
    a susceptor comprising a heating face of heating a semiconductor and a back face and a supporting part bonded with said back face of said susceptor,
    wherein said susceptor comprises a ceramic material comprising magnesium, aluminum, oxygen and nitrogen as main components, and
    wherein said ceramic material comprises at least 50 vol % magnesium-aluminum oxynitride phase exhibiting an XRD peak at least in 2θ=47 to 50° taken by using CuKα ray.

2. The heating apparatus of claim 1, wherein said supporting part comprises said ceramic material.

3. The heating apparatus of claim 1, further comprising:
    a heat generator embedded in said susceptor; and
    an electrical supplying member contained in an inner space of said supporting part and electrically connected to said heat generator.

4. The heating apparatus of claim 1, wherein said 2θ is 47 to 49°.

5. The heating apparatus of claim 1, said ceramic material comprising a sub phase comprising a crystal phase of MgO—AlN solid solution wherein aluminum nitride is dissolved into magnesium oxide.

6. The heating apparatus of claim 5, wherein said MgO—AlN solid solution has XRD peaks at (200) and (220) faces taken by using CuKα ray in ranges of 2θ=42.9 to 44.8° and 62.3 to 65.2°, respectively, which are between peaks of cubic phase of magnesium oxide and cubic phase of aluminum nitride, respectively.

7. The heating apparatus of claim 5, wherein said MgO—AlN solid solution has an XRD peak at (111) face taken by using CuKα ray in a range of 2θ=36.9 to 39°, which is between peaks of cubic phase of magnesium oxide and cubic phase of aluminum nitride.

8. The heating apparatus of claim 1, wherein said ceramic material does not contain AlN crystal phase.

9. The heating apparatus of claim 1, wherein a magnesium source in raw materials used for producing said ceramic material comprises MgO.

10. The heating apparatus of claim 1, wherein said ceramic material has an open porosity of 0.12% or lower.

* * * * *